United States Patent
Ohmura et al.

(10) Patent No.: US 6,376,347 B1
(45) Date of Patent: Apr. 23, 2002

(54) METHOD OF MAKING GATE WIRING LAYER OVER SEMICONDUCTOR SUBSTRATE

(75) Inventors: Mitsuhiro Ohmura; Masaki Narita, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/665,962

(22) Filed: Sep. 21, 2000

(30) Foreign Application Priority Data

Sep. 27, 1999 (JP) .......................... 11-272304

(51) Int. Cl.[7] ................ H01L 21/3205; H01L 21/4763; H01L 21/1302; H01L 21/461
(52) U.S. Cl. ...................... 438/585; 438/624; 438/692
(58) Field of Search ............................... 438/199, 230, 438/231, 232, 303, 364, 365, 725, 381, 396, 574, 637, 648, 692, 624, 626, 585

(56) References Cited

U.S. PATENT DOCUMENTS

| | | | | |
|---|---|---|---|---|
| 5,219,787 A | * | 6/1993 | Carey et al. | 437/187 |
| 5,617,273 A | * | 4/1997 | Carr et al. | 360/105 |
| 5,639,686 A | * | 6/1997 | Hirano et al. | 437/189 |
| 5,761,790 A | * | 6/1998 | Carr et al. | 29/603.15 |
| 6,040,248 A | * | 3/2000 | Chen et al. | 438/692 |
| 6,080,470 A | * | 6/2000 | Dorfman | 428/216 |
| 6,181,055 B1 | * | 1/2001 | Patterson et al. | 313/310 |
| 6,265,315 B1 | * | 7/2001 | Lee et al. | 438/725 |

FOREIGN PATENT DOCUMENTS

| | | |
|---|---|---|
| JP | 6-37058 | 2/1994 |
| JP | 11-74508 | 3/1999 |

* cited by examiner

Primary Examiner—John F. Niebling
Assistant Examiner—Walter L. Lindsay, Jr.
(74) Attorney, Agent, or Firm—Finnegan, Henderson, Farabow, Garrett & Dunner, L.L.P.

(57) ABSTRACT

Disclosed is a method of making a gate wiring layer, in which a carbon-based layer is patterned by dry etching using a gas that does not etch a gate insulating layer so as to form a gate wiring layer without deteriorating the gate insulating layer and without etching the semiconductor substrate. In forming a gate insulating layer and a gate wiring layer on a semiconductor substrate, a carbon-based layer is formed on a semiconductor substrate, followed by forming a predetermined mask on the layer for patterning the layer. The carbon-based layer is etched by dry etching using an oxygen gas, a carbon monoxide gas or a mixed gas containing an oxygen gas, a nitrogen gas, a carbon monoxide gas and an argon gas and without containing a halogen gas. The etching is selectively stopped by the insulating layer. The insulating layer of, for example, $SiO_2$ is etched by dry etching using a halogen-containing gas, but is scarcely etched by dry etching using an oxygen-containing gas that does not contain a halogen gas.

18 Claims, 10 Drawing Sheets

METHOD OF MAKING GATE WIRING LAYER OVER SEMICONDUCTOR SUBSTRATE

CROSS-REFERENCE TO RELATED APPLICATIONS

This application is based upon and claims the benefit of priority from the prior Japanese Patent Application No. 11-272304, filed Sep. 27, 1999, the entire contents of which are incorporated herein by reference.

BACKGROUND OF THE INVENTION

The present invention relates to a method of manufacturing a semiconductor device, particularly, to a method of making a gate wiring layer of a semiconductor device.

In making a gate wiring layer on a semiconductor substrate, it has been carried out to pattern a film of a gate wiring material by dry etching.

FIG. 5D is a cross sectional view showing a semiconductor substrate having a gate wiring layer. As shown in the drawing, an insulating layer 102 of, for example, a silicon oxide film ($SiO_2$) is provided on a semiconductor substrate 101 such as a silicon substrate, and a gate wiring layer 103 is formed on the surface of the insulating film 102. The gate wiring layer 103 is electrically connected to a capacitor formed in the semiconductor substrate 101 or a metal wiring layer (not shown) on the silicon semiconductor substrate 101. An insulating spacer 106 of, for example, a silicon nitride ($Si_3N_4$) layer is provided on the side wall of the gate wiring layer 103, and an insulating layer 107 of, for example, a silicon oxide ($SiO_2$) layer is provided to cover the gate wiring layer 103. The gate wiring layer 103 is formed of a material such as silicon, polycrystalline silicon (polysilicon), or tungsten, or a stacked layer of these materials.

The method of making the conventional gate wiring layer will now be described with reference to FIGS. 5A to 5D. In the first step, formed successively on a semiconductor substrate 101 are a gate insulating layer 102, a conductive layer of a gate wiring layer 103, and an antireflection layer 104 for preventing the reflected light from acting on a photoresist layer, as shown in FIG. 5A. The antireflection layer 104 is composed of an organic compound. Then, a photoresist layer 105 is formed on the antireflection layer 104 and patterned by a lithography technique so as to have a configuration similar to that of the gate wiring layer, as shown in FIG. 5B. Then, using the patterned photoresist layer 105 as a mask, the antireflection layer 104 and the conductive layer are etched by dry etching to provide a gate wiring layer 103 having a predetermined pattern. After removing the photoresist layer 105 and the antireflection layer 104, an insulating layer 106 is deposited over the substrate surface as shown in FIG. 5C. Further, the insulating layer 106 is etched back by the dry etching to provide an insulating spacer 106 at the side wall of the gate wiring layer 103, followed by depositing an insulating layer 107 to cover the gate wiring 103 therewith, as shown in FIG. 5D.

When the conductive layer of the gate wiring layer 103 provided over the semiconductor substrate 101 is etched by using the photoresist layer 105 used as the mask, the etching treatment must be stopped so that the gate insulating layer 102 on the semiconductor substrate 101 is unremoved. In the case of under-etching as shown in FIG. 6A, a trailing configuration may be caused between the gate wiring layers, or sufficient etching may not be carried out to provide an electrical short-circuiting in the gate wiring layers. Also, in the case of over-etching as shown in FIG. 6B, the gate insulating layer 102 may be etched by a halogen-gas such as HBr or $Cl_2$, which are contained in the etching gas used for selectively etching the conductive layer of the gate wiring layers, and the semiconductor substrate 101 may also be etched. In recent years, the gate insulating layer will be made thinner and thinner in order to increase the operating speed of the MOS transistor. As a result, it will be difficult to control the etching process of the conductive layer of the gate wiring layers without removing the gate insulating layer over the entire surface of the semiconductor substrate.

Further, the gate insulating layer interposed between the semiconductor substrate and the gate wiring layers will be subjected to plasma damage by selective etching of the conductive layer and by deposition of an insulating layer using plasma CVD (Chemical Vapor Deposition).

BRIEF SUMMARY OF THE INVENTION

An object of the present invention is to provide a method of making a gate wiring layer of a semiconductor device, which permits selectively stopping the etching treatment not to etch the gate insulating layer.

Another object of the present invention is to provide a method of making a gate wiring layer of a semiconductor device, which utilizes a carbon-based layer.

Still another object of the present invention is to provide a method of making a gate wiring layer of a semiconductor device, which utilizes a carbon-based layer for preventing the gate insulating layer and the semiconductor substrate from being etched.

The present invention is directed to a method of making a gate wiring layer on a semiconductor substrate and comprises the step of forming an insulating layer of, for example, $SiO_2$ on a semiconductor substrate, the step of forming a carbon-based layer, the step of forming a predetermined mask on the carbon-based layer, and the step of patterning the carbon-based layer. It should be noted that the carbon-based layer is subjected to dry etching using an oxygen gas, a carbon monoxide gas or a mixed gas containing an oxygen gas, a nitrogen gas, a carbon monoxide gas and an argon gas and not containing halogen such that the etching is selectively stopped before the insulating layer is etched.

The insulating layer of, for example, $SiO_2$ is etched by the dry etching using a gas containing halogen such as F and Cl. However, the reactive etching does not almost proceeds, by the dry etching using a gas of oxygen, nitrogen, carbon monoxide or argon, the gas not containing the halogen, or a mixed gas thereof.

According to a first aspect of the present invention, there is provided a method of manufacturing a semiconductor device, comprising the steps of forming an insulating layer on a semiconductor substrate; forming a carbon-based layer on the insulating layer; forming a mask of a predetermined pattern on the carbon-based layer; etching the carbon-based layer with a gas containing oxygen by using the mask, thereby providing an opening therein; burying a conductive material within the opening of the carbon-based layer after removing the mask therefrom; and removing the carbon-based layer.

According to a second aspect of the present invention, there is provided a method of manufacturing a semiconductor device, comprising the steps of forming a first insulating layer on a semiconductor substrate; forming a carbon-based layer on the first insulating layer; forming a mask having a predetermined pattern on the carbon-based layer; etching the carbon-based layer with an oxygen-containing gas to form a predetermined pattern; removing the mask and forming a second insulating layer on the first insulating layer in a manner to bury the patterned carbon-based layer; removing the carbon-based layer to form an opening in the second insulating layer; and burying a conductive material in the opening.

In this case, after the insulating layer at the bottom of the opening is removed, an insulating layer corresponding to the gate insulating layer may be formed at the bottom.

According to a third aspect of the present invention, there is provided a method of manufacturing a semiconductor device, comprising the steps of forming a first insulating layer on a semiconductor substrate; forming a carbon-based layer on the first insulating layer; forming a second insulating layer on the carbon-based layer; forming a mask having a predetermined pattern on the second insulating layer; selectively removing the second insulating film by using the mask to expose the carbon-based layer; selectively etching the exposed carbon-based layer with an oxygen-containing gas to provide an opening in the carbon-based layer; burying a conductive material in the opening of the carbon-based layer; and removing the carbon-based layer.

According to a fourth aspect of the present invention, there is provided a method of manufacturing a semiconductor device, comprising the steps of forming a first insulating layer on a semiconductor substrate; forming a carbon-based layer on the first insulating film; forming a second insulating layer on the carbon-based layer; forming a mask having a predetermined pattern on the second insulating layer; selectively removing the second insulating layer by using the mask; etching the carbon-based layer with an oxygen-containing gas by using the mask to provide a predetermined pattern; removing the mask and subsequently forming a third insulating layer on the second insulating layer to bury the patterned carbon-based layer; removing the carbon-based layer to provide an opening in the third insulating layer; and burying a conductive material in the opening of the third insulating layer.

Using a photoresist material as the mask, an organic silicon oxide layer may be interposed between the photoresist layer and the carbon-based layer. The etching gas does not contain a halogen gas and is composed of a mixed gas of an oxygen gas and a carbon monoxide gas or a mixed gas of an oxygen gas, a nitrogen gas, a carbon monoxide gas and an argon gas.

As the gate insulating layer, a single layer of silicon, polysilicon or tungsten, or a stacked layer of these materials may be employed. The thickness of the first insulating layer may be defined by 10 nm or less.

As materials of the carbon-based layer, novolak resin, polyvinylphenol, polymethacrylate, polyarylene, polyaryleneether, or polyimide and the like can be used in addition to a carbon layer. Since the carbon-based layer is subjected to a heat treatment such as a diffusion process, it is desirable for the carbon-based layer to be formed of, particularly, a material having a high heat resistance. Therefore, it is preferable to use polyarylene, polyaryleneether or polyimide.

Since it is difficult to dissolve these organic materials in a solvent, it is desirable to prepare solution materials. According to the necessity, a thermal polymerization inhibitor for improving the storage stability, an adhesion strength improving agent for improving the adhesion strength to the layer to be processed, a conductive material, a material for generating conductivity by light or heat, and a surface active agent for improving the coating properties may be added to the solvent. As the solvents, which are not particularly limited in the present invention, given are for example, ketone series solvents such as acetone, methyl ethyl ketone, methyl isobutyl ketone, and cyclohexane; cellosolve series solvents such as methylcellosolve, methylcellosolve acetate, and ethylcellosolve; ester series solvents such as ethyl lactate, ethyl acetate, butyl acetate, and isoamyl acetate; alcohol series solvents such as methanol, ethanol, and isopropanol; as well as anisol, toluene, xylene, naphtha and water.

As described above, a masking solution is prepared. After a substrate is coated with the masking solution by, for example, spin coating, it is heated to evaporate the masking solution, thereby providing a masking layer thereupon. The heating temperature, which is not particularly limited in the present invention, may be in a range of 100° C.–500° C. If the heating temperature is lower than 100° C., it is difficult to dry the solvent as desired. However, if the heating temperature exceeds 500° C., it is possible for the processed layer to be denatured.

The carbon-based layer may be formed by, for example, a sputtering technique, a CVD technique, or a coating technique in which the substrate is coated with a material dissolved in a solvent, followed by applying a heat treatment to the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

Figure 1A:
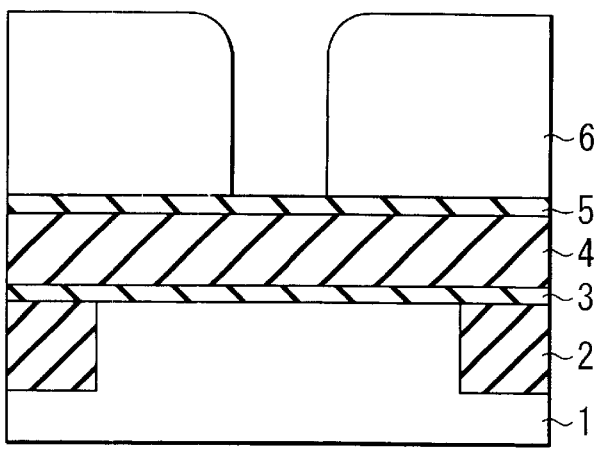
FIGS. 1A to 1G are cross sectional views showing a process for making a gate wiring layer according to a first embodiment of the present invention.
Figure 1B:
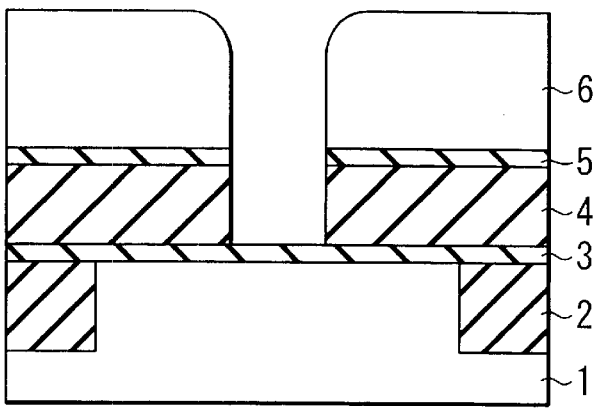

A first embodiment of the present invention will now be described with reference to FIGS. 1A to 1G showing a process of making a MOS transistor in a semiconductor substrate. In the first step, an isolation region 2 is provided in a semiconductor substrate 1 such as a p-type silicon substrate by, for example, an STI (Shallow Trench Isolation) technique. Then, a first insulating layer 3 of, for example, $SiO_2$ is formed on the semiconductor substrate 1, followed by forming a carbon-base layer 4, e.g., a carbon layer, on the first insulating layer 3 and subsequently forming an organic antireflection layer 5 serving to prevent the reflected light from acting on a photoresist layer formed on the carbon-based layer 4. These first insulating layer 3, carbon-based layer 4, and antireflection layer 5 are formed by an oxidation technique, a CVD technique or a spin coating technique. Further, the antireflection layer 5 is coated with a photoresist layer 6, followed by patterning the photoresist layer 6 by a lithography technique as shown in FIG. 1A. Then, the antireflection layer 5 is selectively removed by dry etching to pattern the carbon layer 4 by the dry etching using an oxygen-containing gas such as an oxygen gas as an etching gas, as shown in FIG. 1B.

Figure 1C:
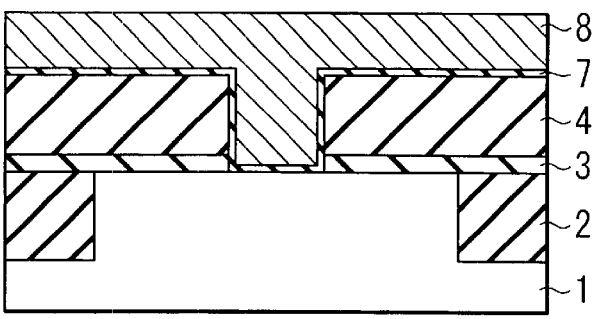

Further, after the photoresist layer 6 and the antireflection layer 5 are removed by ashing, wet etching or the like, the exposed first insulating layer 3 is removed by the wet etching. Thereafter, a gate insulating layer 7 of, for example, $SiO_2$ and a gate wiring material layer 8 are successively deposited by CVD and sputtering techniques, as shown in FIG. 1C.

Figure 1D:
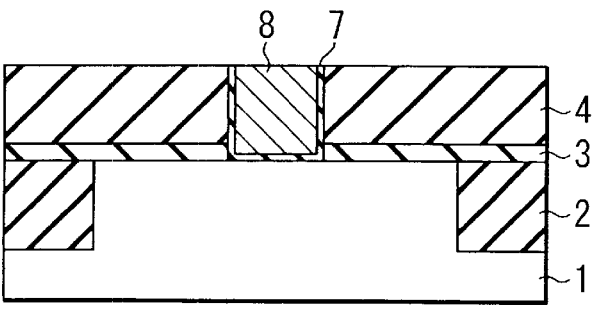
Figure 1E:
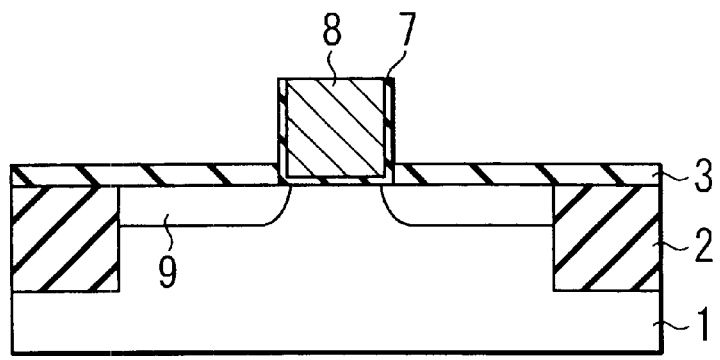
Figure 1F:
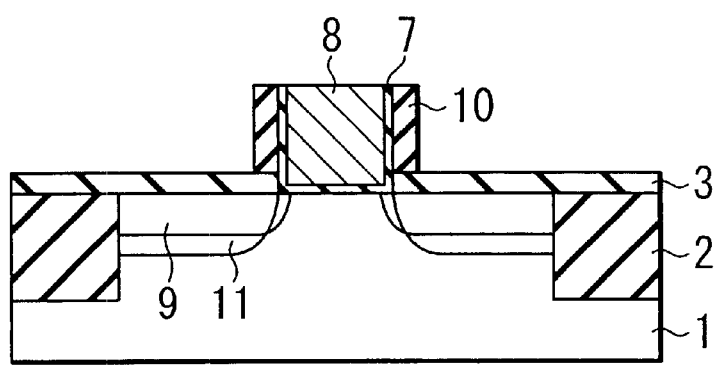

Further, the gate insulating layer 7 and the gate wiring material layer 8 are removed by chemical mechanical polishing (CMP) until the surface of the carbon layer 4 is exposed. As a result, a gate insulating layer 7 and a gate wiring layer 8 are provided upon the semiconductor substrate 1 as shown in FIG. 1D. The exposed carbon layer 4 is removed by the dry etching using an oxygen-containing gas such as an oxygen gas. Thereafter, an extension diffusion region 9 is provided by an ion implantation technique as shown in FIG. 1E. After a second insulating layer 10 of, for example, $Si_3N_4$ is deposited over the substrate surface by the CVD technique, it is etched back by the dry etching until the surface of the first insulating layer 3 is exposed to provide an insulating spacer 10 on the side wall of the gate wiring layer 8. Then, source and drain regions 11 are provided by the ion implantation technique as shown in FIG. 1F.

Figure 1G:
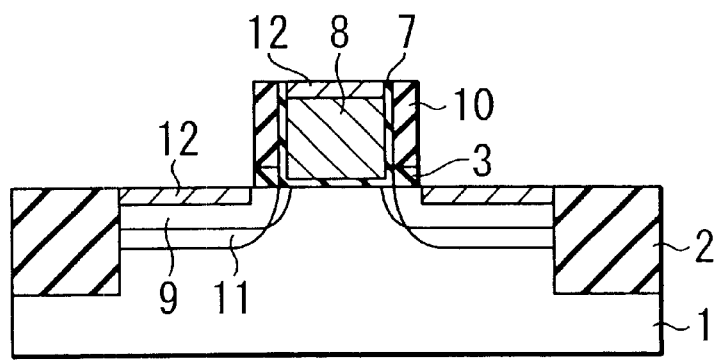

In the next step, after the first insulating layer 3 exposed to the substrate surface is removed, a metal silicide layer 12 of $CoSi_2$, $TiSi_2$ or the like is provided on the gate wiring layer 8 and on the source-drain regions 11 by a salicide process technique as shown in FIG. 1G.

In the first embodiment described above, the first insulating layer can be used as a gate insulating layer. The insulating layer of, for example, $SiO_2$ can be etched by the dry etching using a gas containing the halogen such as F and Cl. However, the reaction etching of the insulating layer does not almost proceed by the dry etching using a gas composed of oxygen, nitrogen, carbon monoxide, argon or the like or a mixed gas thereof, which does not contain the halogen. Therefore, the first insulating layer can be used as the gate insulating layer. However, it may be unavoidable for the etched surface to be roughened to some extent. Therefore, the first insulating layer is removed, followed by newly forming a gate insulating film in the first embodiment described above. As a result, the option of the material will be increased. In addition, since the CVD technique, the sputtering technique, etc may be applied as well as the thermal oxidation technique, it will be possible to increase the option of the forming method.

According to the process described above, it will be possible to manufacture a MISFET including a gate insulating layer using a highly dielectric material and having low resistance of the gate, source and drain regions lowered by the metal silicide layer.

A second embodiment of the present invention will now be described with reference to FIGS. 2A to 2H.

Figure 2A:
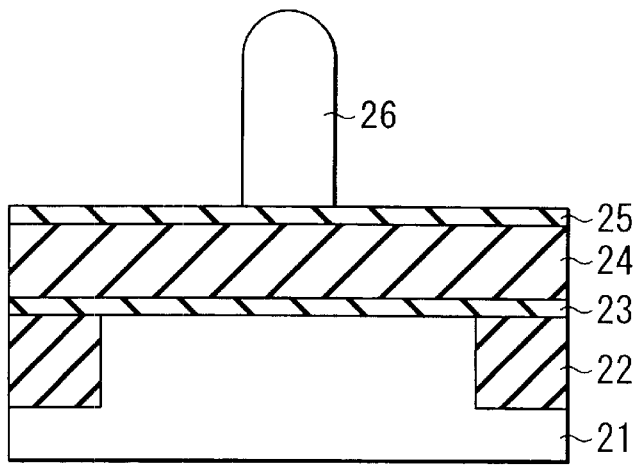
FIGS. 2A to 2H are cross sectional views showing a process for making a gate wiring layer according to a second embodiment of the present invention.
Figure 2B:
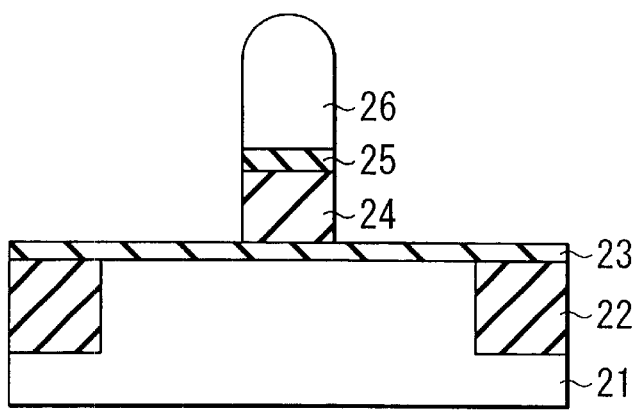
Figure 2C:
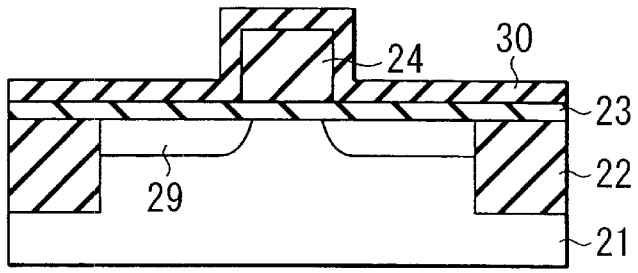

In the first step, an isolation region 22 is provided in a semiconductor substrate 21 using the STI technique. Then, formed successively on the surface of the semiconductor substrate 21 are a first insulating layer 23 of, for example, $SiO_2$, a carbon-based layer 24 such as a carbon layer, an organic antireflection layer 25 serving to prevent the reflected light from acting on a photoresist layer by using an oxidation technique, a CVD technique or a spin coating technique. Further, a photoresist layer 26 formed on the antireflection layer 25 is patterned by a lithography technique as shown in FIG. 2A. Then, the antireflection layer 25 is selectively removed by the dry etching, followed by patterning the carbon-based layer 24 by the dry etching using an oxygen-containing gas such as an oxygen gas to leave a dummy wiring layer 24 unremoved, as shown in FIG. 2B. Further, the photoresist layer 26 and the antireflection layer 25 are removed by ashing, wet etching, etc., followed by forming an extension diffusion region 29 by using the ion implantation technique and subsequently depositing a second insulating layer 30 of, for example, $Si_3N_4$ by using, for example, the CVD technique, as shown in FIG. 2C.

Figure 2D:
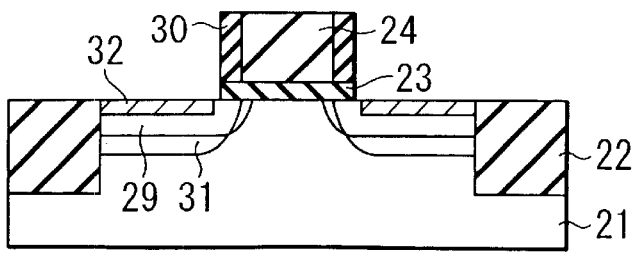

In the next step, the second insulating layer 30 is etched back by the dry etching until the surface of the first insulating layer 23 is exposed to provide an insulating spacer 30 on the side wall of the dummy layer 24. Then, source.drain regions 31 are provided by the ion implantation technique and the exposed first insulating layer 23 is removed from the substrate surface, followed by forming a metal silicide layer 32 on the source.drain region 31 as shown in FIG. 2D.

Figure 2E:
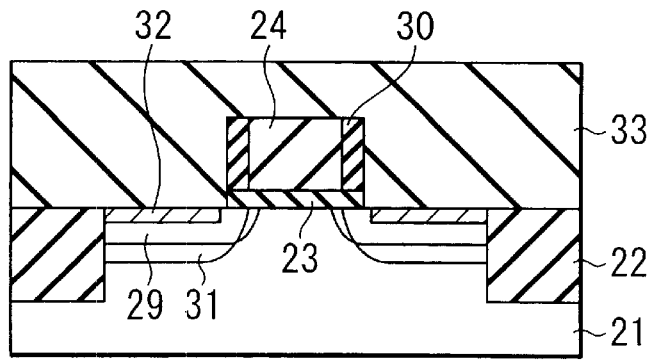
Figure 2F:
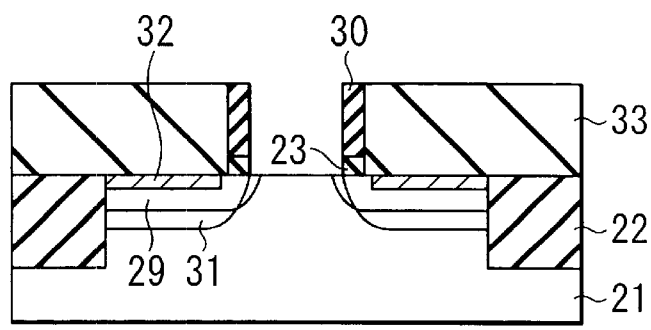

Further, a third insulating layer 33 is deposited by, for example, the CVD technique as shown in FIG. 2E, and is removed by the chemical mechanical polishing technique until the surface of the dummy layer 24 is exposed. Then, the dummy layer 24 is removed by the dry etching using an oxygen-containing gas such as an oxygen gas to remove the exposed first insulating layer 23, as shown in FIG. 2F.

Figure 2G:
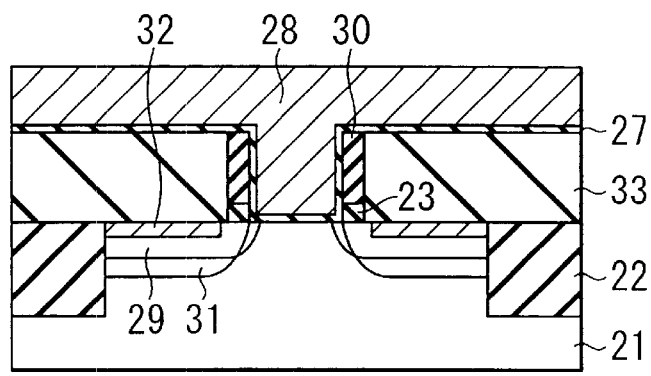
Figure 2H:
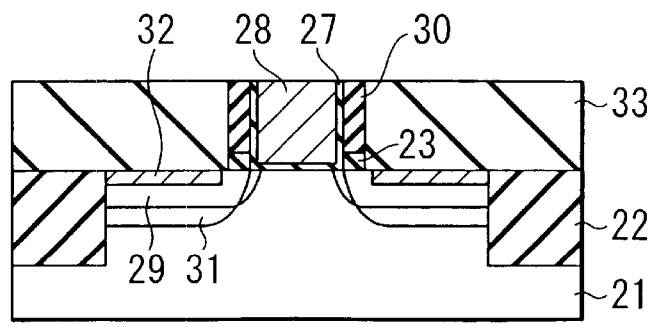

In the next step, a gate insulating layer 27 and a gate wiring material layer 28 are successively deposited on the semiconductor substrate 21 by the CVD technique, the sputtering technique, etc., as shown in FIG. 2G. These gate insulating layer 27 and gate wiring material layer 28 are removed by the chemical mechanical polishing technique until the third insulating layer 33 is exposed to provide the gate insulating layer 27 and the gate wiring layer 28 within the opening surrounded by the insulating spacer 30, as shown in FIG. 2H.

According to the process described above, a high dielectric material is used for the gate insulating layer, a metal layer is used for the gate wiring layer, and a metal silicide layer is provided on the source.drain regions. Therefore, A MISFET with a lowered resistivity can be made.

The method of the present invention for manufacturing a semiconductor device can also be applied to the manufacture of a semiconductor device of a CMOS structure.

In each of the first and second embodiments described above, the resist mask is employed for etching the carbon-based layer. However, considering the trend of decrease of the thickness of the photoresist layer in a fine structure of the device, it is possible for the selectivity ratio of A/B, where A represents the carbon-based layer and B represents the resist layer, to be deficient. In this case, it is assumed that the photoresist layer and the antireflection layer can be removed. Where the selectivity ratio is deficient and it is difficult to remove the photoresist layer and the antireflection layer, it may be considered that a hard mask material, such as an organic silicon oxide layer, a silicon oxide layer, a silicon nitride layer or an amorphous silicon layer, is interposed between the photoresist layer and the carbon-based layer (or, in the case of using an antireflection layer, between the antireflection layer and the carbon-based layer). Examples of using a coating type organic silicon oxide layer will now be described as third and fourth embodiments of the present invention.

The third embodiment of the present invention will now be described with reference to FIGS. 3A to 3G.

Figure 3A:
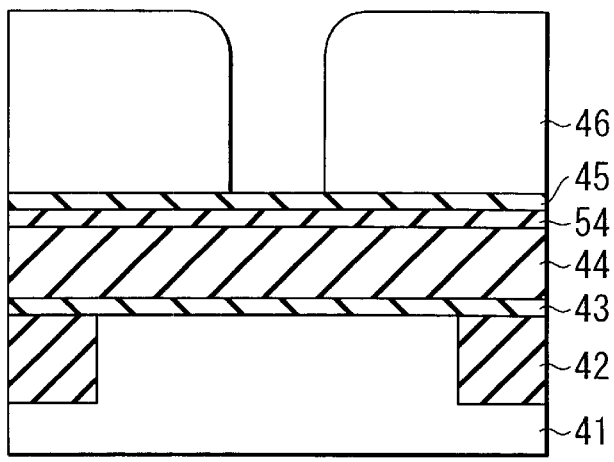
FIGS. 3A to 3G are cross sectional views showing a process for making a gate wiring layer according to a third embodiment of the present invention.

In the first step, an isolation region 42 is provided by, for example, the STI technique in a semiconductor substrate 41. Then, successively formed on the semiconductor substrate 41 are a first insulating layer 43, a carbon-based layer 44, an organic silicon oxide layer 54 and an antireflection layer 45 for preventing the reflected light from acting on a photoresist layer by the oxidation technique, the CVD technique or the spin coating technique. Further, a photoresist layer 46 is formed on the antireflection layer 45 and, then, patterned by using the lithography technique, as shown in FIG. 3A.

Figure 3B:
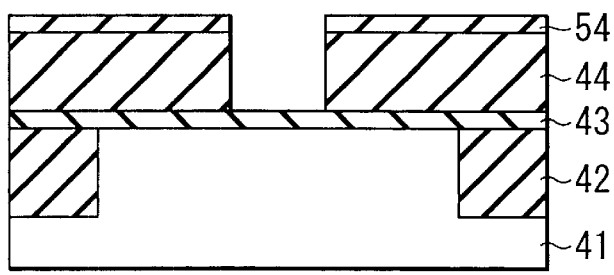

In the next step, the exposed antireflection layer 45 and the organic silicon oxide layer 54 are selectively removed by using the dry etching, followed by pattering the exposed carbon-based layer 44 by the dry etching using an oxygen-containing gas such as an oxygen gas, as shown in FIG. 3B. In this step, the photoresist 46 and the antireflection layer 45 are also removed simultaneously.

Figure 3C:
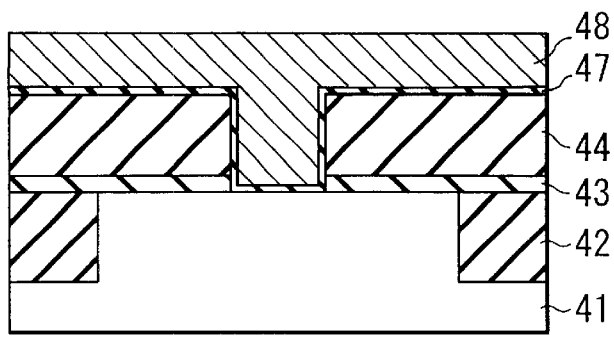

Further, after the first insulating layer 43 and the organic silicon oxide layer 54 exposed by patterning of the carbon-based layer 44 are removed by the wet processing technique, a gate insulating layer 47 and a gate wiring material layer 48 are successively deposited by CVD and the sputtering techniques, as shown in FIG. 3C.

Figure 3D:
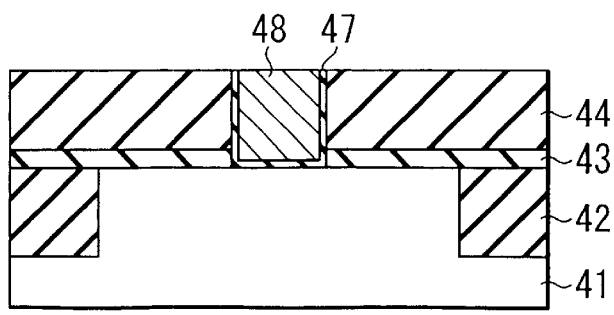
Figure 3E:
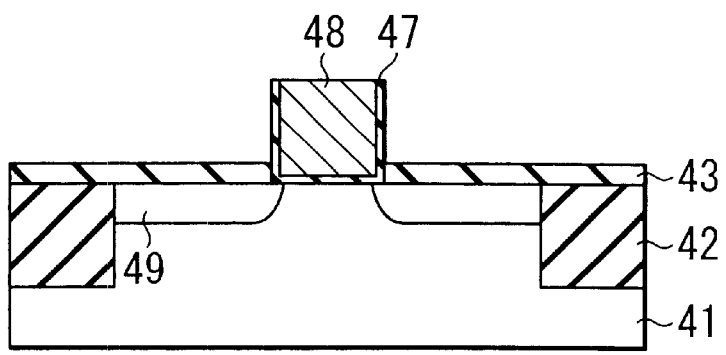

Then, the gate insulating layer 47 and the gate wiring material layer 48 are removed by mechanical polishing until the surface of the carbon-based layer 44 is exposed, as shown in FIG. 3D. Thereafter, the exposed carbon-based layer 44 is removed by the dry etching using an oxygen-containing gas such as an oxygen gas, followed by forming an extension diffusion region 49 by means of the ion implantation technique, as shown in FIG. 3E.

Figure 3F:
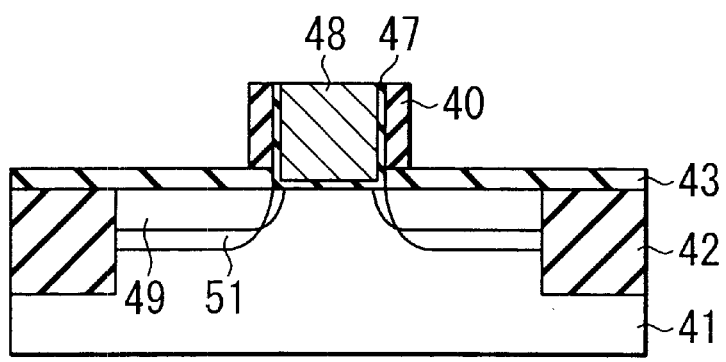
Figure 3G:
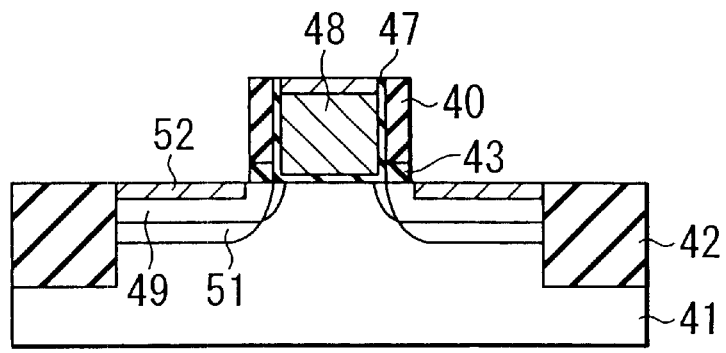

After a second insulating layer 40 is deposited by the CVD technique, it is etched back by the dry etching until the surface of the first insulating layer 43 is exposed to provide an insulating spacer 40 on the side wall of the gate wiring layer 48. Source.drain diffused regions 51 are then provided by the ion implantation technique and the exposed first insulating layer 47 is removed from the substrate surface, as shown in FIG. 3F.

In the next step, a metal silicide layer 52 of, for example, $CoSi_2$ or $TiSi_2$ is provided on the surfaces of the gate wiring layer and the source.drain regions by the salicide process technique, as shown in FIG. 1C.

As described above, it can be possible to provide accurately the gate wiring layer even if the selectivity ratio of the carbon-based layer to the photoresist is deficient.

The fourth embodiment of the present invention will now be described with reference to FIGS. 4A to 4H.

In each of the first and second embodiments, the use of the photoresist mask in the ion implantation step for selectively implanting P-type and N-type ions is omitted in forming the extension diffusion region. Of course, the first and second embodiments are on the assumption that the photoresist layer and the antireflection layer on the carbon-based layer can be removed by the ashing technique and the wet processing technique. Also, these embodiments, which include removal of the photoresist layer and the antireflection layer and deposition and removal of the photoresist mask for selectively implanting the ions, are on the assumption that it is possible to perform the deposition and removal of the particular layers. Where it is difficult to perform the formation and removal of the particular layers, they are carried out by using a hard mask, e.g., an organic silicon oxide layer, described below. In this method, the upper portion of the carbon-based layer is covered with the hard mask, making it possible to remove the photoresist layer on the carbon-based layer by means of, for example, a RIE technique with reduced lateral etching.

In the case of the process using a dummy gate, which is described as follows, it may be considered to deposit a hard mask material such as an organic silicon oxide layer or a silicon oxide layer for forming the hard mask (silicon oxide-based material is desirable for the simultaneous removal with the first insulating layer 13).

An organic silicon oxide layer is used in the fourth embodiment shown in FIGS. 4A to 4H.

Figure 4A:
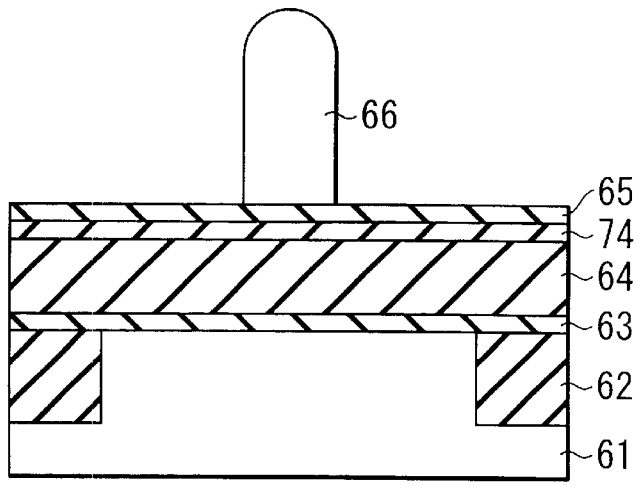
FIGS. 4A to 4H are cross sectional views showing a process for making a gate wiring layer according to a fourth embodiment of the present invention.

In the first step, an isolation region 62 is provided by, for example, the STI technique, on a semiconductor substrate 61. Thereafter, successively formed on the semiconductor substrate 61 are a first insulating layer 63, a carbon-based layer 64, an organic silicon oxide layer 74, and an antireflection layer 65 for preventing the reflected light from acting on a photoresist layer by the oxidization technique, the CVD technique or the spin coating technique. Then, a photoresist layer 66 is formed on the antireflection layer 65 and patterned by the lithography technique, as shown in FIG. 4A.

Figure 4B:
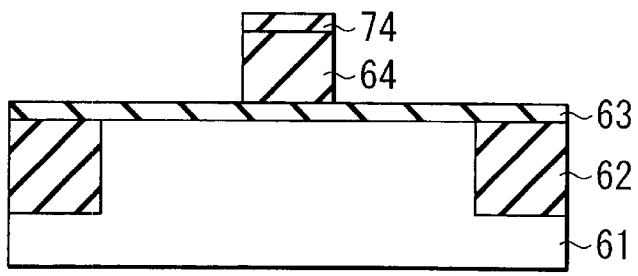
Figure 4C:
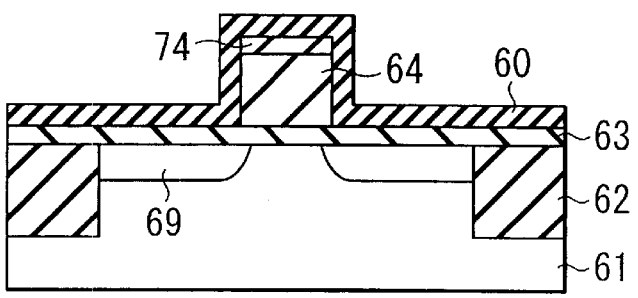

In the next step, the antireflection layer 65 and the organic silicon oxide layer 74 are removed by the dry etching, followed by patterning the carbon-based layer 64 by dry etching to provide a dummy gate wiring layer that is to be removed in the subsequent step, as shown in FIG. 4B. In this step, the photoresist layer 66 and the antireflection film 65 are also removed simultaneously. Thereafter, an extension diffusion region 69 is provided by means of the ion implantation technique, followed by depositing a second insulating layer (insulating spacer) 60 on the substrate surface by, for example, the CVD technique, as shown in FIG. 4C.

Figure 4D:
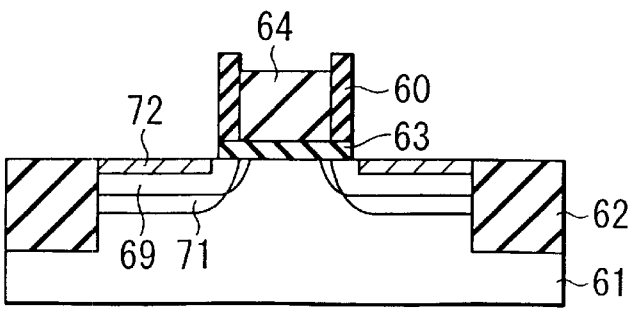

Then, the second insulating layer (insulating spacer) 60 is etched back by the dry etching until the surface of the first insulating layer 63 is exposed to provide an insulating spacer 60 on the side wall of the dummy date insulating layer 64, followed by forming source.drain regions 71 by the ion implantation technique. Then, the first insulating layer 63 exposed on the surface of the semiconductor substrate 61 is removed, as shown in FIG. 4D. In this step, the organic silicon oxide layer 74 on the upper surface of the carbon-based layer 64 is removed simultaneously.

Figure 4E:
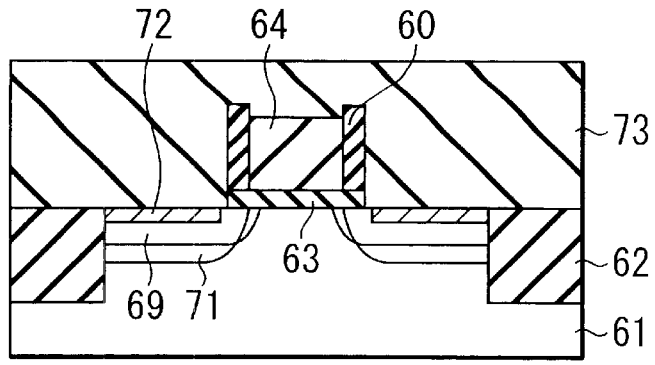
Figure 4F:
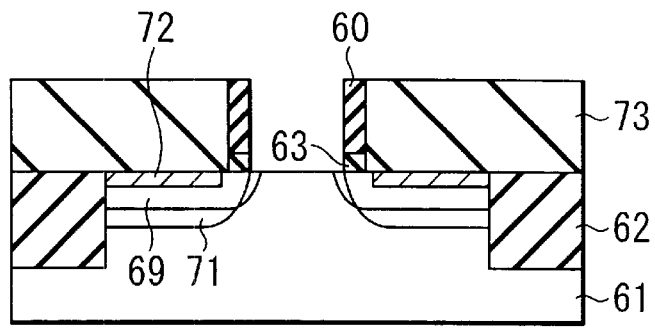

Thereafter, a third insulating layer 73 is deposited by, for example, the CVD technique, as shown in FIG. 4E, followed by removing the third insulating layer 73 by chemical mechanical polishing until the surface of the dummy gate wiring layer 64 is exposed. Then, the dummy gate wiring layer 64 is removed by, for example, the dry etching using an oxygen-containing gas such as an oxygen gas, followed by removing the exposed first insulating layer 63 by the wet processing technique, as shown in FIG. 4F.

Figure 4G:
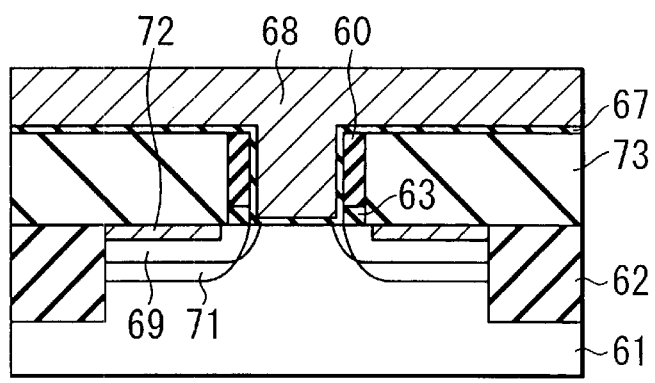
Figure 4H:
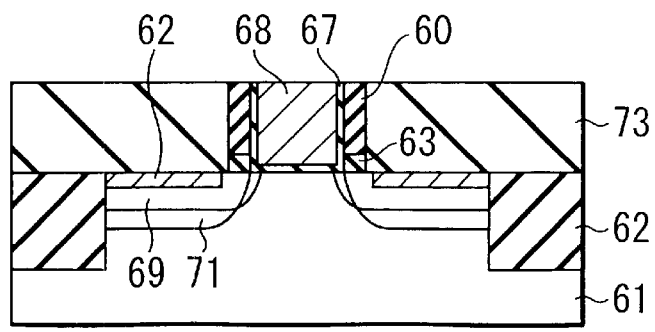
Figure 5A:
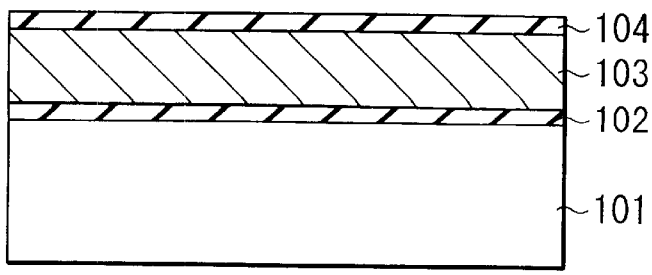
FIGS. 5A to 5D are cross sectional views showing a process for making a gate wiring layer according to a prior art method.
Figure 5B:
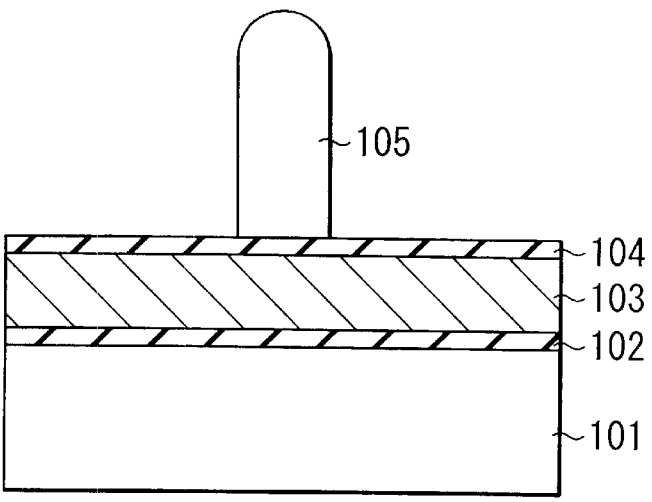
Figure 5C:
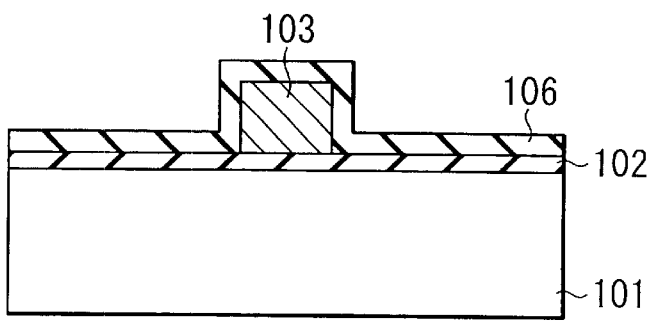
Figure 5D:
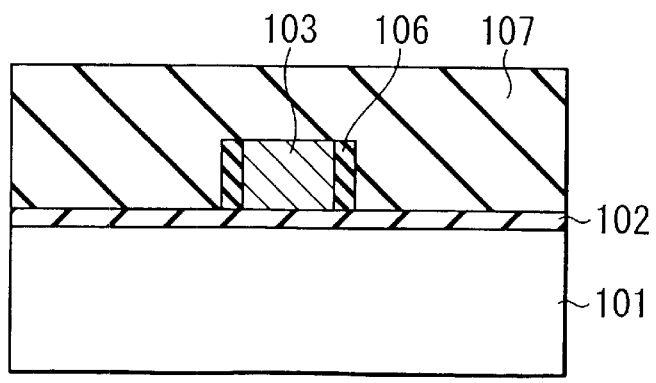
Figure 6A:
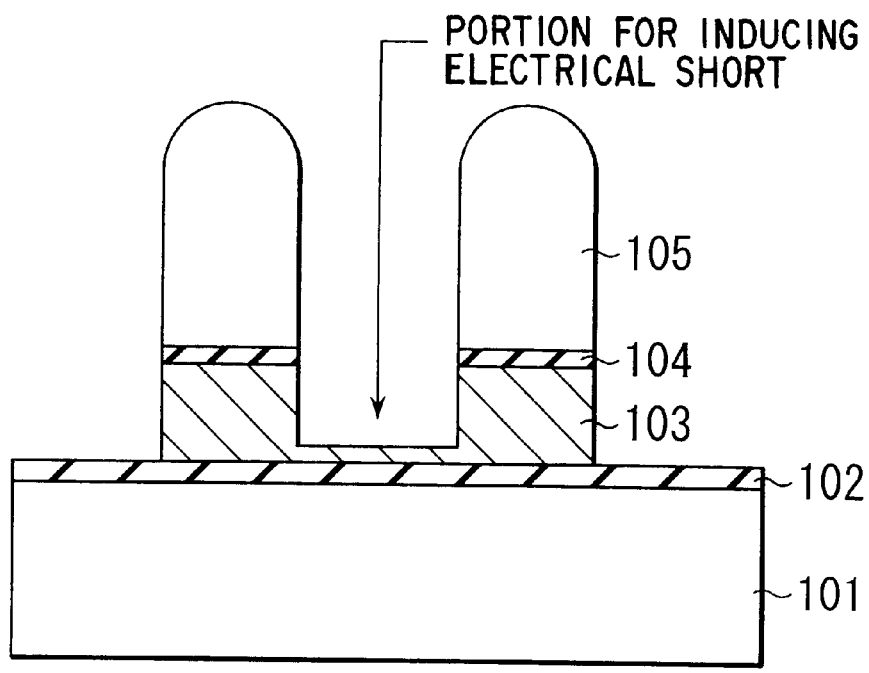
FIGS. 6A and 6B are cross sectional views for explaining problems of the prior art method.
Figure 6B:
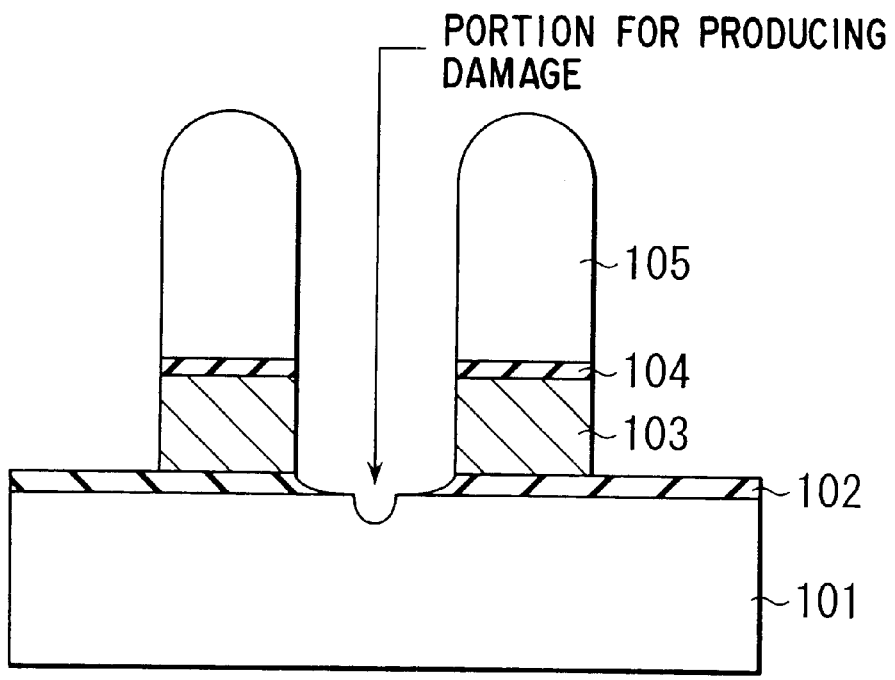

Further, a gate insulating layer 67 and a gate wiring material layer 68 are deposited on the exposed semiconductor substrate 61 by, for example, the CVD technique or the sputtering technique, as shown in FIG. 4G. Still further, the gate wiring material layer 68 and the gate insulating layer 67 are removed by the chemical mechanical polishing until the surface of the third insulating layer 73 is exposed, as shown in FIG. 4H.

According to the process described above, it is possible to manufacture a MISFFT with reduced resistivity which includes a gate insulating layer formed of a highly dielectric material, because the gate wiring layer is provided by a metal layer and the source.drain regions are composed of the metal silicide, respectively. Even where the selectivity ratio of the carbon-based layer to the photoresist layer is deficient, it can be possible to provide the gate wiring layer accurately.

According to the present invention, as described above, the carbon-based layer is patterned by the dry, etching, and the gas, e.g., the oxygen gas, that does not etch the insulating layer such as the gate insulating layer is used. Therefore, the wiring layer will be made without deteriorating the insulating layer and without doing damage to the semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
    forming an insulating layer on a semicondeuctor substrate;
    forming a carbon-based layer on said insulating layer;
    forming a mask having a predetermined pattern on said carbon-based layer,
    selectively etching said carbon-based layer with an oxygen-containing gas by using said mask to provide an opening therein;
    burying a conductive material within said opening after removing said mask; and
    removing said carbon-based layer.

2. The method according to claim 1, wherein said oxygen-containing gas is without halogen.

3. The method according to claim 1, wherein said oxygen-containing gas is selected from an oxygen gas, a carbon monoxide gas, and a mixed gas containing an oxygen gas, a nitrogen gas, a carbon monoxide gas and an argon gas without a halogen gas.

4. The method according to claim 1, wherein said insulating layer exposed within said opening is removed and a gate insulating layer is newly deposited within said opening.

5. The method according to claim 1, wherein said carbon-based layer is selected from materials composed of novolac resin, polyvinyl phenol, polymethacrylate, polyarylene, polyarylene ether and polyimide in addition to carbon.

6. The method according to claim 1, wherein the buried conductive material is used as a gate electrode wiring layer.

7. A method of manufacturing a semiconductor device comprising the steps of:
    forming a first insulating layer on a semiconductor substrate;
    forming a carbon-based layer on said first insulating layer;
    forming a mask having a predetermined pattern on said carbon-based layer;
    etching said carbon-based layer with an oxygen-containing gas by using said mask to provide a predetermined pattern thereon;
    depositing a second insulating layer over said first insulating layer to cover the patterned carbon-based layer therewith after removing said mask;
    removing said patterned carbon-based layer to form an opening in said second insulating layer; and
    burying a conductive material in said opening.

8. The method according to claim 7, wherein said oxygen-containing gas is without halogen.

9. The method according to claim 7, wherein said oxygen-containing gas is selected from an oxygen gas, a carbon monoxide gas, and a mixed gas containing an oxygen gas, a nitrogen gas, a carbon monoxide gas and an argon gas without a halogen gas.

10. The method according to claim 7, wherein said patterned carbon-based layer is used as a dummy gate for defining a gate insulating layer, a gate electrode wiring layer, and source and drain regions, respectively.

11. A method of manufacturing a semiconductor device comprising the steps of:
    forming a first insulating layer on a semiconductor substrate;
    forming a carbon-based layer on said first insulating layer;
    forming a second insulating layer on said carbon-based layer;
    forming a mask having a predetermined pattern on said second insulating layer;
    selectively removing said second insulating layer by using said mask to expose said carbon-based layer;
    selectively etching said carbon-based layer with an oxygen-containing gas to provide an opening therein;
    burying a conductive material in said opening of said carbon-based layer; and
    removing said carbon-based layer.

12. The method according to claim 11, wherein said oxygen-containing gas is without halogen.

13. The method according to claim 11, wherein said oxygen-containing gas is selected from an oxygen gas, a carbon monoxide gas, and a mixed gas containing an oxygen gas, a nitrogen gas, a carbon monoxide gas and an argon gas without a halogen gas.

14. The method according to claim 11, wherein the buried conductive material is used as a gate electrode wiring layer.

15. A method of manufacturing a semiconductor device comprising the steps of:
    forming a first insulating layer on a semiconductor substrate;
    forming a carbon-based layer on said first insulating layer;
    forming a second insulating layer on said carbon-based layer;
    forming a mask having a predetermined pattern on said second insulating layer;
    selectively removing said second insulating layer by using said mask;
    etching said carbon-based layer with an oxygen-containing gas by using said mask to provide a predetermined pattern thereon;
    depositing a third insulating layer over said second insulating layer to cover the patterned carbon-based layer therewith after removing said mask;

removing said patterned carbon-based layer to form an opening in said third insulating layer; and burying a conductive material in said opening.

16. The method according to claim 15, wherein said oxygen-containing gas is without halogen.

17. The method according to claim 15, wherein said oxygen-containing gas is selected from an oxygen gas, a carbon monoxide gas, and a mixed gas containing an oxygen gas, a nitrogen gas, a carbon monoxide gas and an argon gas without a halogen gas.

18. The method according to claim 15, wherein said patterned carbon-based layer is used as a dummy gate for defining a gate insulating layer, a gate electrode wiring layer, and source and drain regions, respectively.

* * * * *

UNITED STATES PATENT AND TRADEMARK OFFICE
CERTIFICATE OF CORRECTION

PATENT NO. : 6,376,347 B1
DATED : April 23, 2002
INVENTOR(S) : Ohmura et al.

It is certified that error appears in the above-identified patent and that said Letters Patent is hereby corrected as shown below:

<u>Column 9,</u>
Line 36, change "semicondeuctor" to -- semiconductor --.
Line 40, change "layer," to -- layer; --.

Signed and Sealed this

Eleventh Day of February, 2003

JAMES E. ROGAN
*Director of the United States Patent and Trademark Office*